United States Patent

[11] 3,588,408

[72] Inventors William F. Beausoleil;
Edward C. Uberbacher, both of
Poughkeepsie, N.Y.
[21] Appl. No. 836,912
[22] Filed June 26, 1969
[45] Patented June 28, 1971
[73] Assignee International Business Machines
Corporation
Armonk, N.Y.

[54] PULSE SWITCHING APPARATUS
12 Claims, 9 Drawing Figs.

[52] U.S. Cl. .......... 200/152, 200/81.6, 200/166
[51] Int. Cl. .......... H01h 29/00
[50] Field of Search .......... 200/81.6, 152.9, 46, 166 (CPL), 153

[56] References Cited
UNITED STATES PATENTS

| | | | |
|---|---|---|---|
| 2,669,631 | 2/1954 | Oplinger et al. | 200/81.6X |
| 3,492,612 | 1/1970 | Ayres et al. | 200/81.6X |

*Primary Examiner*—Robert K. Schaefer
*Assistant Examiner*—H. J. Hohauser
*Attorneys*—Hanifin and Jancin and Harold H. Sweeney, Jr.

ABSTRACT: A printed circuit on a circuit board is arranged to give a sequential pulse output when the circuit is completed. A channel is attached to the circuit board so as to cross various circuit lines. At each cross point between a circuit line and the channel, there is a gap in the circuit such that the gap can be bridged by a conductive pellet travelling through the channel thus completing the circuit to provide the pulse output. The device can be programmed or preconditioned by providing a second channel which crosses the circuit lines and which has gaps in the circuit lines where the second channel crosses. A reservoir of conductive material is connected to the second channel and is adapted to be energized in accordance with an associated device such as a cammed counter wheel. The conductive material rises and ebbs in the second channel in accordance with pressure applied to the reservoir thus bridging a corresponding number of gaps. The conductive pellet, as it passes through the first channel, produces pulses at the output by completing the circuits of only those circuit lines which are preconditioned by having the second gaps in the second channel bridged by the conductive material therein.

INVENTORS
WILLIAM F. BEAUSOLEIL
EDWARD C. UBERBACHER
BY [signature]
ATTORNEY

PULSE SWITCHING APPARATUS

This invention relates to sequential pulse switching and more particularly, to sequential pulse switching of printed circuits and the programming of the circuits in accordance with a change in conditions.

In today's technology, especially the computer technology, there are many situations in which fixed information such as a serial number or other identification indicia may have to be repeatedly entered manually by an operator. If the number of times this same identifying number has to be entered is large enough, it becomes practical to provide a device which will automatically, upon initiation, enter the desired fixed identifying indicia or number. Probably, the best known example of where such a device might be utilized is in the telephone art where the same number is frequently called. For such situations, a card reader is available where the number to be frequently called is permanently stored on a card in machine readable form, which card is inserted in the reader and the number is thereby automatically obtained without the necessity for conventional dialing. The card reader is capable of sensing one of a variety of numbers in accordance with the particular card which is inserted therein. This device would be impractical where only one number is to be obtained a number of times automatically. Accordingly, the present device could be used to insert fixed information in sequential pulse form where the wiring is obtained by the conventional printed circuit wiring techniques and the switching is obtained by a simple no-bounce switching arrangement.

It is another object of the present invention to provide a sequential pulse switching device which can be packaged in a very small space and is accordingly compatible with miniaturized techniques.

It is another object of the present invention to provide a sequential pulse switching device which is very economical to manufacture and which utilizes known printed circuit techniques for fabrication.

It is another object of the present invention to provide a sequential pulse switching device which is simply programmable.

It is a further object of the present invention to provide a sequential pulse switching device which can be automatically adjusted to provide a sequential pulse output which corresponds to the numerical settings of a counter.

A circuit board is provided having a predetermined circuit pattern thereon. A channel is attached to the board and gaps are provided in the circuit lines where the channel crosses thereover. An electrically conductive pellet of material is adapted to pass through the channel so as to bridge the gaps in the circuitry thereby completing sequentially a predetermined circuit pattern on the board and producing a predetermined output pulse sequence. The conductive pellet is propelled by means of a pressure initiating means attached to one end of the channel.

The above arrangement can be programmed by utilizing a second channel attached to the circuit board which has second gaps in the circuit lines where the second channel crosses thereover. A reservoir of conducting fluid is arranged at one end of the second channel and the conducting fluid therein is adapted to rise and ebb in the channel in accordance with an initiating means attached thereto. Accordingly, a corresponding number of gaps will be bridged by the conducting fluid. The conductive pellet, as it bridges the gaps sequentially in the first channel, will complete only those circuits in which the conducting fluid has bridged the gap in the second channel.

The foregoing and other objects, features and advantages of the invention will be apparent from the following more particular description of preferred embodiments of the invention, as illustrated in the accompanying drawings.

Figure 3:
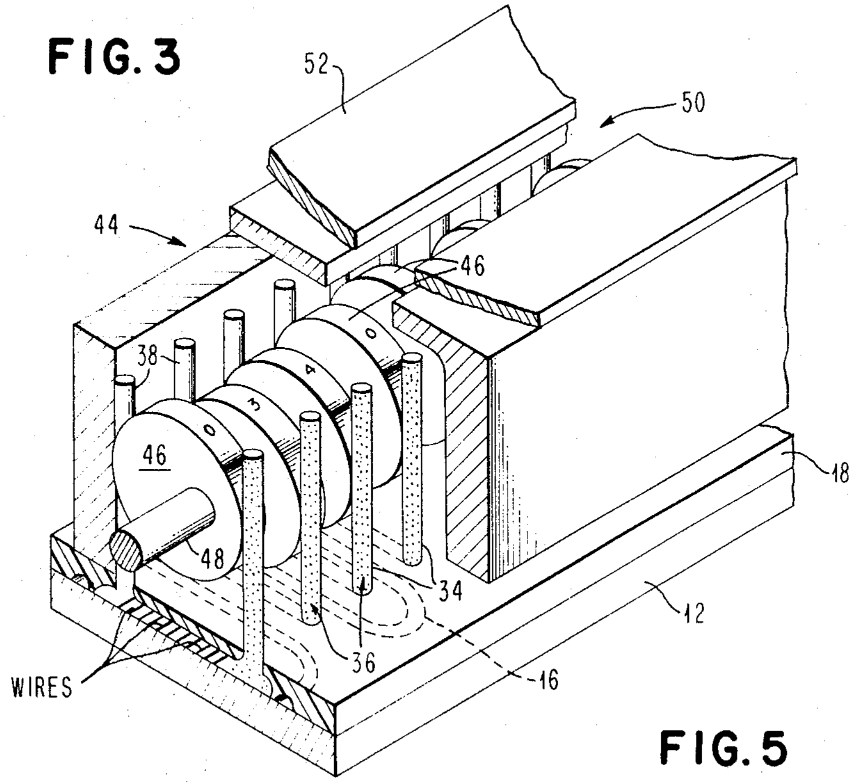
FIG. 3 is a perspective view of a counter, the setting of which can be read out in digital pulse form.
Figure 4:
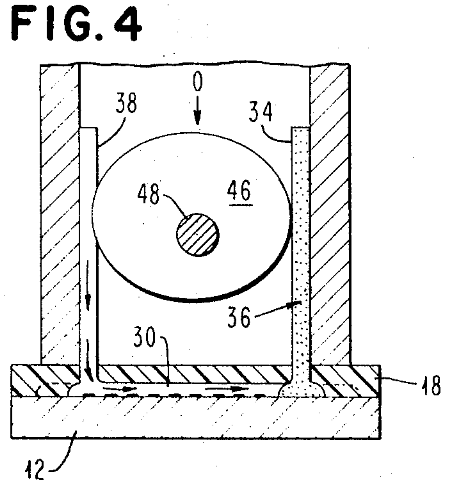
Figure 5:
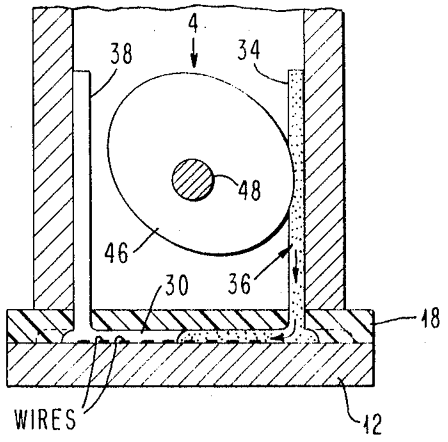
Figure 6:
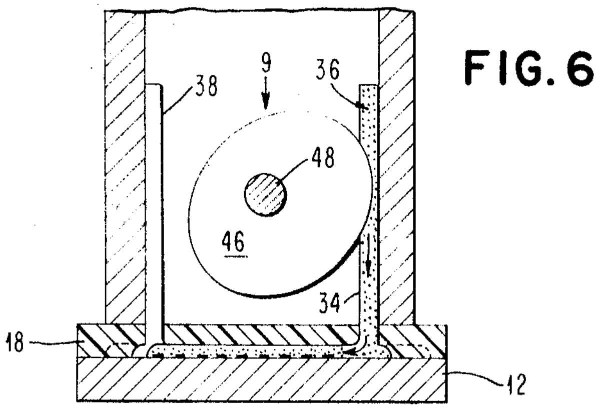

FIGS. 4, 5 and 6 shows the camming operation of the counterwheels of the counter of FIG. 3 for positions 0, 4 and 9, respectively.

Figure 7:
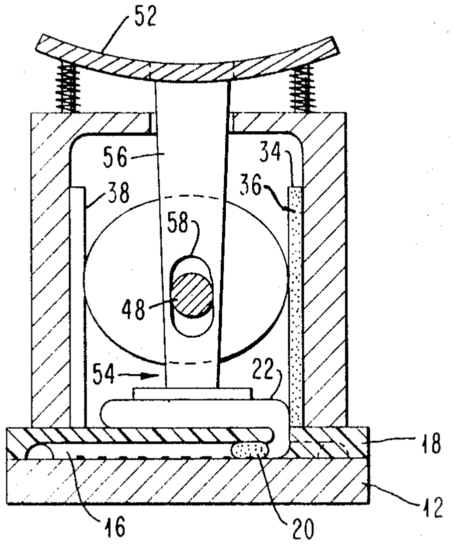

FIG. 7 is a cross-sectional view of the counter showing the operating mechanism to propel the conductive pellet through the channel.

Figure 8:
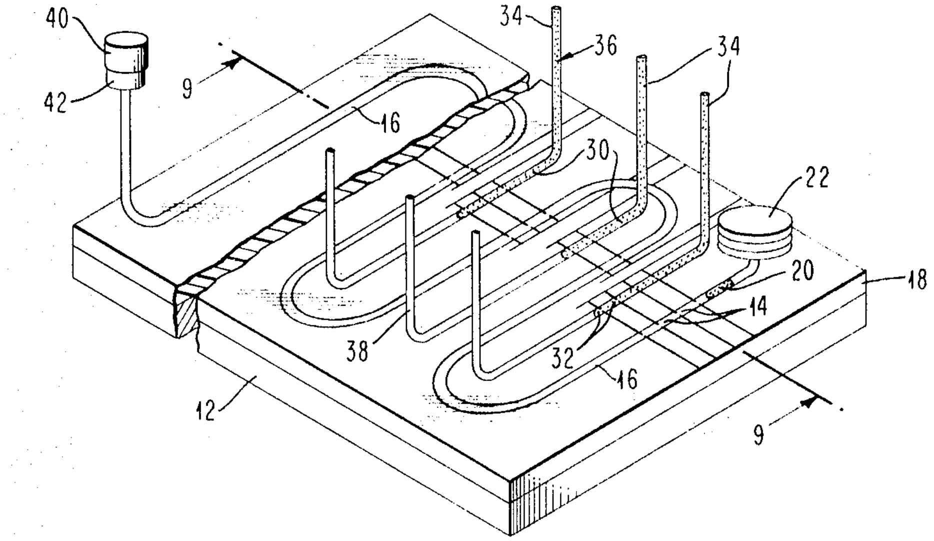

FIG. 8 is a schematic representation of a circuit board and the channel arrangement thereon showing how the circuitry is programmed in accordance with the counter cam wheel setting to produce a corresponding pulse output.

Figure 9:
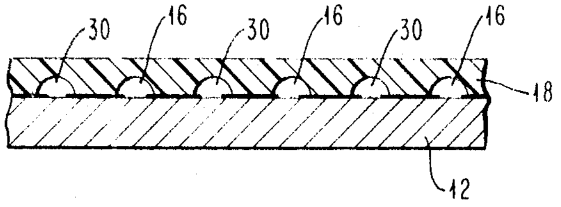

FIG. 9 is a cross section taken along 9–9 of FIG. 8 showing the relationship of the channels and circuit board.

Figure 1:
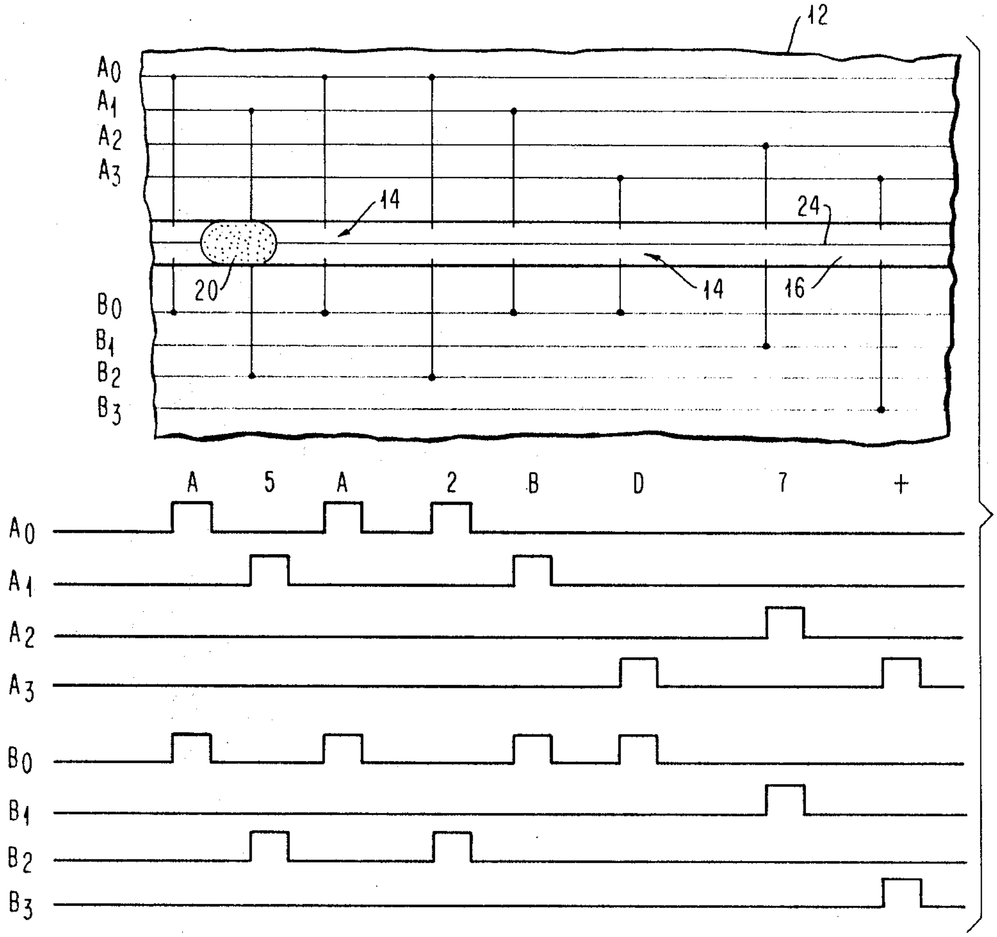
FIG. 1 is a plan view of a portion of a printed circuit board showing the printed circuit wiring, the channel attached thereto and the pulse output pattern obtained as a conductive pellet passes thru the channel.

Referring to FIG. 1, there is shown a predetermined wiring arrangement on a printed board 12. The wiring is represented by four rows $A_0'$—$_{A3}$ on the upper half of the board and four additional rows $B_0$—$B_3$ on the lower half. A row on the upper half of the board is connected to a row on the lower half by printed wiring running crosswise thereto or in the column direction. The connections to the rows are represented by dots on the diagram. Each printed wire column has a gap 14 in the wiring where a channel 16 crosses thereover. The channel 16 is connected to the board 12 and is in the form of a semicircle as can be seen from FIG. 9. Actually, the channel 16 is a groove molded into a sheet of material 18, such as plastic, which is nonconductive and which is attached directly to the printed board 12 by a nonconductive adhesive. Each of the ends of the printed wire forming the gap 14 extend sufficiently into the channel 16 such that a pellet of conductive material 20 passing through the channel 16 will momentarily bridge the gap 14 in each circuit line sequentially thus completing each circuit sequentially. The electrically conductive pellet 20, such as mercury, is propelled through the channel 16 by a pressure initiating device 22 such as a bellows shown in FIG. 2. The channel 16 can be filled with a nonconductive fluid such as distilled water or one of the fluorocarbons used in cooling systems. The pressure initiating device 22 would cause sufficient pressure to propel the conductive pellet 20 through the fluid filled channel 16. The sequential pulse output which is obtained from the predetermined wiring arrangement shown in FIG. 1 is correlated therewith by having the same rows marked $A_0$—$A_3$ and $B_0$—$B_3$. As the conductive pellet passes the respective column, the pulses are obtained as outputs from the $A_0$—$B_3$ circuit rows. The combinations of the pulses among the eight rows taken in a vertical direction can be utilized to represent some particular desired indicia such as numbers or letters as is indicated by A5A2BD7+ shown above the vertical pulse arrangement on FIG. 1. As has been pointed out previously, this could represent a fixed serial number or other identifying indicia which is to be entered into equipment, such as a computer, sufficiently often to warrant a simple one-operation means of entering the desired information. The pulse combinations obtained could also be used to energize tone oscillators such as are found in the touch tone telephone. It should be noted that the channel 16 has a printed circuit line 24 running down the center thereof such that the gap 14 of the circuit line columns when bridged are not only connected together but are mutually connected to common potential line 24 thus completing the circuit.

Figure 2:
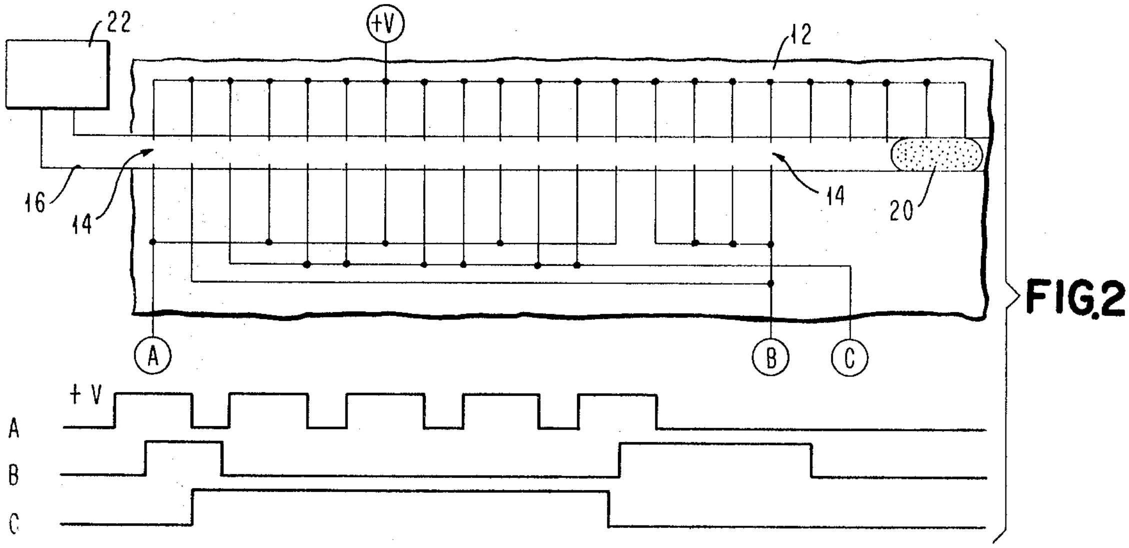
FIG. 2 shows a second printed wiring arrangement on a board and the resulting pulse pattern when the conductive pellet bridges more than one circuit line at a time.

It is not necessary that the common circuit line 24 be present, since obviously the circuitry can be completed by just bridging the gap 14, as shown in FIG. 2. FIG. 2 has the additional feature that the conductive pellet 20 is sufficiently long to bridge two printed wiring lines simultaneously. This provides a further flexibility in obtaining pulse outputs. There are only three printed circuit rows, rows A, B and C. Because of the length of the conductive pellet 20, allowing simultaneous bridging of adjacent circuit lines, output pulses from different rows can be made to overlap as seen between A, B and C output pulses designated in FIG. 2. Actually, the pellet 20 shown in FIG. 2 is sufficiently long to just bridge the gap of the third circuit line as the bridging of the first circuit line is broken. Thus, the output on line C is one long pulse, since at least one of the circuit lines connected to output C has a bridged gap 14 at any instant of time.

In connection with the above-described sequential switching circuits, the pulse output is fixed. Of course, the pulse sequence can be altered by an alteration of the circuit on the circuit board 12. This is impractical, therefore, the above-described device is only utilizable where a fixed pulse output is desired. The arrangement can be made variable, that is, the pulse output can be changed as desired by utilizing a programming or presetting means such as shown in FIG. 8. In FIG. 8, the channel 16 through which the mercury or conductive pellet is propelled is shown having a circuitous path along the circuit board 12. This is for convenience in packaging rather than having a long circuit board. A second channel 30 is shown connected to the circuit board 12 and crossing the same circuit lines or group of circuit lines as is crossed by the first channel 16. Similar to the first channel 16 crossings, the circuit lines have gaps 32 therein where the second channel 30 crosses the circuit lines. At one end of the second channel 30 there is a fluid reservoir 34 containing a sufficient amount of conductive fluid 36 to fill the entire channel 30 when the fluid is forced from the reservoir 34. The conductive fluid 36, as it rises and ebbs in the channel 30, correspondingly bridges the gaps 32 in the circuitry. It will be appreciated, that if the reservoir 34 has a regulated pressure applied thereto, the mercury 36 will rise or ebb in the channel accordingly, thus bridging a corresponding number of circuit line gaps 32. This is essentially a means of programming, since only those circuits will produce an output pulse when read which have the gaps 32 associated with the second channel 30 bridged by the conductive fluid 36 which condition is dependent on the amount of pressure applied at the reservoir 34. The readout is obtained by energizing the pressure producing means 22, such as a bellows, which propels the conductive pellet 20 along the first channel 16 where it sequentially bridges the gaps 14 in the circuit lines crossed by the channel 16. Only those circuit lines will be completed and produce a pulse output that have the second gap 32 thereof bridged by the conductive fluid 36 in the second channel 30 of the programming means. Thus, only those circuits will be completed which have been preconditioned by the programming means.

In FIG. 8, a number of separate programming means are shown each connected with a different group of circuits on the same board. The circuitous course of the reading means makes the same reading means available for each of the groups of circuits and programming means on the same board 12. In other words, the reading means is common to each of the programming means shown. Each of the programming means has, at the end opposite the pressure initiating means 34, an expansion tank 38 so that the air forced along the channel 30 by the rising column of conductive material 36 will not build up an excessive back pressure. The expansion tank 38 is shown as an open ended vertical column of tubing. In connection with the reading means, a pressure expansion tank 40 is provided at the end of the circuitous channel 16. Also, a speed valve 42 is connected thereto at the end of the channel 16 so that the air which is forced along the channel 16 in front of the conductive pellet 20 as it is propelled through the channel 16 can be bled off at a predetermined speed thus somewhat controlling the speed with which the conductive pellet 20 proceeds through the channel 16.

When the conductive reading pellet 20 reaches the end of its channel 16, the bridging of the last printed line gap can complete a circuit to the power source which disconnects the power source to the printed circuit so that a readout would not be obtained upon the return of the pellet 20 to the start condition. The pellet 20 would be returned by virtue of the force created by a vacuum behind the conductive pellet 20 caused by the expansion of the bellows 22. Of course, it will be appreciated that an external path could be provided through which the pellet 20 could be brought back to the start position. For example, the expansion tank 40 and speed valve 42 could be located adjacent the bellows 22 so that the propelling of the pellet 20 would bring it thru a return path to the expansion tank 40 near the bellows 22, perhaps slightly above, and the pellet 20 could feed by gravity means into the starting position just below or at the bottom of the bellows 22.

Of course, the exact opposite operation can be performed by having the last of the circuit lines, when completed by the bridging of its gap by the pellet 20, actuate a switch connecting the power to the circuitry such that the reading or the pulse output could be obtained during the bridging of the gaps 14 on return of the pellet 20 to the start position.

Referring to FIG. 9, the reading channel 16 and the programming channel 30 are shown molded into an overlay 18 which is directly attached to the printed circuit board 12. This overlay 18, as previously mentioned, is made of a plastic nonconductive material and attached to the board 12 by a nonconductive adhesive. Of course, there are a number of other ways channels could be connected to the circuit board 12. For example, the circuit board 12 could have a canal cut therein and a flat nonconductive material overlay connected thereto.

There are a number of ways that the programming means can be regulated. Referring to FIG. 3, there is shown a counter 44, wherein the setting of the counterwheels 46 determine the height to which the conductive liquid 36 in the programming channels 30 will rise. The counter 44 consists of a number of counterwheels 46 each of which is located on a common shaft 48. The wheels 46 are specially shaped cams and are located on the shaft 48 eccentrically. As each of the wheels 46 are set to the desired number within the counter 44, the cam periphery exerts pressure on a closed end piece of resilient tubing 34 which forms the reservoir for the conductive fluid 36 of the programming means. Referring to FIGS. 4—6, the operation of the individual counter cam wheels 46 can best be seen. In FIG. 4, the cam counterwheel 46 is shown in its 0 position, that is, with the 0 of the wheel 46 in the reading opening 50 at the top of the counter. In such a position, the cam counterwheel 46 does not exert any pressure on the reservoir tube 34 of the programming means. Without any pressure applied to the tube 34, the conductive fluid 36 remains in the reservoir tube 46. FIG. 5 shows a cam counterwheel 46 in its fourth position, that is, with the numeral 4 in the reading position. In such a position, the cammed counterwheel 46 applies sufficient pressure on the reservoir tube 34 to cause the conductive fluid 36 therein to rise or extend along the channel 30 so that a predetermined number of gaps 32 in the circuit lines are bridged by the conductive fluid 36. Likewise, FIG. 6 shows a cam counterwheel 46 in the number 9 digit reading position. It will be appreciated, that in this position the cam exerts the greatest amount of force against the resilient reservoir tube 34 so that the conducting fluid 36 extends all the way across the channel 30 and bridges the gaps 32 of all the circuit lines crossed. The intermediate positions between 0, 4 and 9 of the cam wheel 46 exert a corresponding amount of pressure on the resilient reservoir tube 34. Accordingly, these intermediate pressure positions cause a corresponding different number of gaps 32 in the circuit lines to be bridged. Thus, the programming means is initiated by the positioning of the various counterwheels 46. If it is desired to change the pulse pattern that is programmed into the device by the counter 44, it is only necessary to change the counterwheel settings to introduce a new indicia. In the counter 44 shown, this is done through the reading opening 50 along the top.

The reading means is initiated by pressing the button 52 at the top of the counter 44. This exerts pressure on the bellows or resilient reservoir 22 where the conductive pellet 20 is located. A cross-sectional diagram showing the pressure energizing means 54 which propels the conductive pellet 20 through its channel 16 is shown in FIG. 7. The button 52 has an elongated extension 56 which has a slot 58 therein through which the counterwheel shaft 48 passes. This slot 58 allows the button 52 to be depressed and the bottom of the extension 56 to apply pressure to a bellows or resilient reservoir 22 arrangement wherein air or liquid is located to cause the propelling of the conductive pellet 20 through its channel 16. A number of different arrangements can be utilized as the pressure initiating means 22 to cause the propulsion of the pellet 20 through its channel 16, i.e. a straightforward bellows which is physically pressed or squeezed would be sufficient.

It will be appreciated that the channel 16 could be filled with a conductive fluid and the pellet 20 could be electrically nonconductive. The circuit board would be wired to produce a sequential pulse output as the nonconductive pellet sequentially interrupts the circuits as it travels through the channel 16.

While the invention has been particularly shown and described with reference to preferred embodiments thereof, it will be understood by those skilled in the art that various changes in form and detail may be made therein without departing from the spirit and scope of the invention.

We claim:

1. A multiple sequential switching apparatus comprising:
- a circuit board;
- a circuit pattern located on said board;
- a channel attached to said board and running along at least a predetermined portion of said board so as to cross said circuit pattern;
- said predetermined circuit pattern having gaps in said circuitry where said channel crosses said circuitry;
- a pellet adapted to pass through said channel so as to bridge said gaps in said circuitry sequentially thereby sequentially affecting the predetermined circuit pattern on said board and producing a predetermined output switching sequence; and
- pressure initiating means for causing said pellet to travel through said channel.

2. Apparatus according to claim 1, wherein said pellet is electrically conductive and sequentially completes the predetermined circuit pattern on said board.

3. Apparatus according to claim 1, wherein said pellet is electrically nonconductive and said channel is full of an electrically conductive fluid, said electrically nonconducting pellet interrupting said electrical circuits sequentially as it bridges said gaps as it travels thru said channel.

4. Apparatus according to claim 2, wherein said circuit board has a fixed potential circuit line on said board running under said channel and through said circuit gaps so that said conductive pellet will sequentially connect said predetermined circuits having said gaps to said fixed potential circuit line.

5. Apparatus according to claim 2, wherein a switch is operated when the furthest gap in said circuitry from said pressure initiating means is bridged by said conductive pellet so that said predetermined circuitry is energized, the conductive pellet completing said circuits by bridging the gaps in sequence on its return passage through said channel thereby substantially fixing the resulting sequential pulse output timing.

6. Apparatus according to claim 2, wherein said conductive pellet is formed of mercury and said pressure initiating means is a bellows operable to produce pressure to propel said mercury pellet through said channel.

7. Apparatus according to claim 1, wherein said circuit board has a calibrated programming device comprising a second channel attached thereto and said predetermined circuitry on said board has second gaps therein where said second channel crosses said circuitry;
- a reservoir of conducting fluid connected to said second channel;
- variable pressure producing means causing said conductive fluid to fill said second channel to a height determined by the amount of pressure produced by said variable pressure producing means thereby bridging said second gaps of a corresponding number of circuits so that reading means consisting of said pellet passing thru said first channel sequentially affects only those circuits in which the second gaps are bridged by said conducting material in said second channel.

8. Apparatus according to claim 7, wherein said circuit board has a plurality of calibrated programming devices associated therewith;
- the conducting fluid within each second channel bridging a number of said second circuit gaps in respective predetermined circuitry corresponding to the pressures generated by the respective variable energizing means;
- said first channel, pellet and energizing means being arranged with respect to first gaps in the respective predetermined circuitry associated with each of said calibrated programming devices so that said pellet when travelling through said first channel sequentially bridges said first gaps of said respective predetermined circuitry thereby sequentially affecting the circuits in each of said predetermined circuitry which has the second gaps bridged by said conducting fluid.

9. Apparatus in accordance with claim 7, wherein each of said variable energizing means comprises a cammed number wheel of a counter, the number wheel cam having the cam surface along the periphery of said number wheel and being shaped in accordance with the numbering on said counterwheel, the cam surface applying pressure to said conductive fluid reservoir in accordance with the number selected on said wheel thereby causing the conductive fluid to extend along said second channel a distance corresponding to said pressure and accordingly bridging said second gaps included in said distance.

10. Apparatus in accordance with claim 9, wherein said energizing means is actuated by a push-type element applying pressure to said energizing means causing said pellet to move through said first channel thereby sequentially bridging said first gaps and affecting the circuits of each of said predetermined circuitry which has the second gaps bridged by said conducting material in said second channel.

11. Apparatus in accordance with claim 7, wherein said first and second channels are grooves molded into a flat sheet of insulative material, said sheet of insulative material is attached to said circuit board by a nonconductive adhesive so that the open portion of said channels face said circuit board and are over said circuit gaps, said gaps being smaller than said channel widths so that a pellet passing through said channel can bridge said gap.

12. Apparatus in accordance with claim 7, wherein said reservoir of conductive material comprises a chamber enclosed by resilient material except for an opening leading to said second channel, said variable pressure energizing means causing sufficient pressure on said resilient material of said chamber to cause a corresponding deflection thereof lessening the size of said chamber thereby forcing the conductive material therein a corresponding distance along said second channel.